United States Patent
Stessen et al.

(10) Patent No.: US 6,297,849 B1
(45) Date of Patent: Oct. 2, 2001

(54) OUTPUT TIMEBASE CORRECTOR

(75) Inventors: Jeroen H. C. J. Stessen; Antonius H. H. J. Nillesen, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/213,532

(22) Filed: Dec. 17, 1998

(30) Foreign Application Priority Data

Dec. 22, 1997 (EP) .................................................. 97204066
Mar. 23, 1998 (EP) .................................................. 98200912

(51) Int. Cl.$^7$ ....................................................... H04N 5/04
(52) U.S. Cl. ......................... 348/500; 348/536; 348/537; 358/158
(58) Field of Search .................................. 348/497, 498, 348/499, 536, 537, 540, 541; 358/158, 159

(56) References Cited

U.S. PATENT DOCUMENTS

| | | | |
|---|---|---|---|
| 5,150,201 | 9/1992 | Mehrgardt et al. | 358/23 |
| 5,181,115 | 1/1993 | Flamm et al. | 358/158 |
| 5,280,352 | 1/1994 | Herrman | 358/160 |
| 5,335,074 | * 8/1994 | Stec | 348/537 |
| 5,404,173 | * 4/1995 | Parrish et al. | 348/537 |
| 5,495,294 | * 2/1996 | Evans et al. | 348/537 |
| 5,574,407 | * 11/1996 | Sauer et al. | 348/540 |
| 5,600,379 | * 2/1997 | Wagner | 348/497 |
| 5,780,120 | * 7/1998 | Cummins et al. | 348/537 |
| 6,100,661 | * 8/2000 | Stessen et al. | 358/158 |

FOREIGN PATENT DOCUMENTS

| | | | | |
|---|---|---|---|---|
| 0576081A1 | 12/1993 | (EP) | | H03H/17/00 |
| 0660514A1 | 6/1995 | (EP) | | H03H/17/00 |
| WO9741680 | 11/1997 | (WO) | | H04N/3/18 |

* cited by examiner

*Primary Examiner*—Reinhard J. Eisenzopf
*Assistant Examiner*—Trang U. Tran

(57) ABSTRACT

An output timebase corrector converts orthogonal sampled video (VS) into asynchronous sampled video (VOS) with asynchronous sample values occurring at clock instants (TC) of a clock signal (CLK). The asynchronous sampled video (VOS) is displayed on a display screen of a display device (DD). A discrete time oscillator (DTO) of a time-discrete phase-locked loop (PLL) supplies a time base signal (OS). The time-discrete phase-locked loop (PLL) determines a phase difference (PE) between the time base signal (OS) and reference instants (FB) indicating a timing of a line deflection of the display device (DD) to obtain the time base signal (OS) being locked to the reference instants (FB). The time base signal (OS) controls a sample rate converter (SRC) such that the asynchronous video values (VOS) which occur at the clock instants (TC) are interpolated from the orthogonal sampled video (VS) by the sample rate converter (SRC) such that the video signal is displayed on the correct position on the display screen. In the output timebase corrector according to the invention all circuits are clocked by clock signals (CLK) originating from one and the same clock generator (OSC).

8 Claims, 5 Drawing Sheets

OUTPUT TIMEBASE CORRECTOR

BACKGROUND OF THE INVENTION

Figure 1:
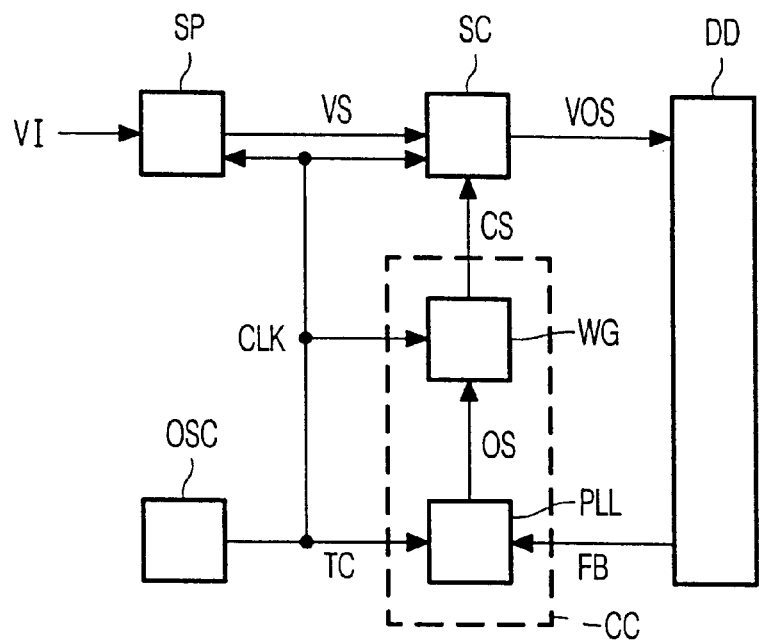

The invention relates to an output timebase corrector as defined in the precharacterizing part of claim 1, and to a display device comprising such an output timebase corrector as defined in the precharacterizing part of claim 8. The invention also relates to an output timebase correction method as defined in the precharacterizing part of claim 7.

U.S. Pat. 5,150,201 discloses a digital television signal-processing circuit with an analog-to-digital converter (further referred to as A/D converter), a color decoder, a skew filter controlled by a phase-locked loop (further referred to as PLL), a signal processor, a dual-port memory controlled by a clock-phase shifter, and a digital to analog converter (further referred to as D/A converter).

The A/D converter supplies a digitized video signal to the color decoder. The color decoder supplies two color difference signals and a luminance signal to the skew filter. The PLL receives a synchronizing signal present in the digitized video signal, and supplies a control signal to the skew filter. The skew filter supplies orthogonal sampled input video signals to the signal processor to facilitate simple video processing, for example filtering. The signal processor supplies orthogonal sampled output video signals to the dual-port memory. The dual-port memory supplies delayed output video signals to the D/A converter to obtain analog video signals to be supplied to a display device. The A/D converter, the color decoder, the skew filter and an input part of the dual-port memory are clocked with the same first clock signal.

The clock-phase shifter receives the first clock signal and a line flyback signal indicating a timing of a line deflection of the display device to supply a second clock signal to an output part of the dual-port memory and the D/A converter. The second clock is derived from the first clock signal by a clock-phase shifter. In such a clock-phase shifter, the first clock signal enters a chain of delay stages whose overall delay is approximately equal to the period of the first clock signal. The taps of all delay stages are connected to associated locking stages which are locked by applying the line flyback signal. The stored phase value can be obtained from the locking stages as a thermometer code specifying the number of delay stages required to delay the first clock signal.

The dual-port memory converts the orthogonal sampled (with the first clock signal) output video signals into delayed output video samples synchronously with the second clock signal. The delay is controlled by the flyback signal.

It is a drawback of the prior-art that two clocks are needed. Although the two clocks have the same frequency, the phases differ dynamically, thereby causing interference. It is also a drawback of the prior-art that the clock-phase shifter is a very delicate analog circuit having a design which depends on the IC process. Moreover, a calibration of the delays is needed as the analog delays vary with temperature, supply voltage and process spread. Due to the two asynchronous clocks, simulations of the prior-art circuit have to be performed with analog simulators, which is a complication.

BRIEF SUMMARY OF THE INVENTION

It is an object of the invention to provide an output timebase corrector which obviates the prior-art drawbacks.

To this end, a first aspect of the invention provides an output time base corrector as defined in claim 1. A second aspect of the invention provides an output timebase correction method as defined in claim 7. A third aspect of the invention provides a display device with an output time base corrector as defined in claim 8. Advantageous embodiments of the invention are defined in the dependent claims.

The output time base corrector receives orthogonal sampled video samples. The orthogonal video samples may be generated by a time-discrete video processor. This video processor receives and supplies orthogonal sampled video samples to facilitate easy processing (for example, one or multi-dimensional filtering) of the video samples in the video processor. The output time base corrector comprises a time-discrete sample rate converter which receives the orthogonal sampled video samples and is controlled by a control signal to supply asynchronous sampled video samples to a display device via a D/A converter. The time-discrete video processor, the sample rate converter, and the D/A converter are clocked with a clock signal which represents clock instants and is generated by one and the same clock generator. The clock generator may generate the clock signal with a very stable frequency by using a crystal.

A discrete time oscillator of a time-discrete phase-locked loop generates the control signal of the sample rate converter as a time base signal which is locked to reference instants related to line positions on a raster-scanned display screen of the display device. The reference instants may be line flyback pulses occurring in a line deflection circuit which generates a line deflection current through a line deflection coil around a cathode ray tube.

The output time base corrector according to the invention converts orthogonal sampled video into a line-locked video which, after low pass filtering, is locked to the reference instants. In the output time base corrector according to the invention, the orthogonal sampled video is clocked with a clock signal which is not locked to the reference instants. That is why the line-locked video is also referred to as asynchronous sampled video samples. The sample values occurring at the clock instants of the clock signal have to be interpolated from the orthogonal sampled video by the sample rate converter. Consequently, the time-discrete phase-locked loop controls the sample rate converter in such a way that the video values occur in the correct position on the display screen.

In the output time base corrector according to the invention, all circuits are clocked by clock signals originating from one and the same clock generator. In principle, the clock generator generates one clock signal. However, it is possible to supply clock frequencies to the different circuits of the output time base corrector, which clock frequencies are an integral multiple of each other and all of which have the same phase. No interference will occur due to different clock-phases, no analog circuits are involved, and the circuit can be simulated with a digital simulator.

In an embodiment as defined in claim 2, a waveform generator receives the time base signal to supply the control signal to the sample rate converter. The control signal is the time base signal adapted in accordance with a desired waveform. The waveform is selected to compensate for a non-constant deflection rate of the electron beam on the display screen. The non-constant deflection rate occurs if expensive measures in the deflection circuitry to obtain a constant deflection rate across the entire screen are not applied (for example, an east-west correction, or when a linearity coil has been omitted). In this way, the imperfections in the deflection are corrected by signal-processing which is cheap and reliable.

In an embodiment as defined in claim 3, the discrete time oscillator integrates an incremental value at every clock instant to generate a periodical time-discrete saw-tooth signal which restarts at a certain start value after a predetermined period of time. The time base signal is locked to the reference instants by controlling the predetermined period of time of the periodical time base signal, dependent on a difference value between a selected reference value and a value of the time base signal at the reference instants. The time base signal restarts at the certain start value (or pre-set value) after the difference value at the reference instant has been determined. The repetition period of the time base signal may be controlled by adapting the increment value or a flyback value. The flyback value is the difference between the last sample value of the time base signal in a certain period of the time base signal and the pre-set value of a succeeding period. The flyback value is generated with sub-clock accuracy. Such a discrete time oscillator per se is described in applicant's patent application PHN 16,696 not yet published herewith incorporated by reference.

In an embodiment as defined in claim 4, the discrete time oscillator generates oscillator values (the time base signal) at the clock instants. The oscillator values are incremented with a fixed increment every clock instant. The period of the sawtooth-shaped time base is controlled by the flyback value. The waveform generator generates polynomial waveforms from a limited amount of selected coefficients by multiplying each polynomial sub-tern by a corresponding coefficient. For example, the waveform generator may generate two-dimensional quadratic-spline waveforms. The waveform generator has a simple construction by replacing the multiplier by integrators, which is possible because the discrete time oscillator has a fixed increment and is controlled by its flyback height or pre-set value. Each integrator receives an integrator start value and an integrator incremental value, and both values are determined by the selected coefficients.

The embodiment as defined in claim 5 has the advantage that the waveform generated by the waveform generator is precisely locked to the discrete time oscillator. The start values and the increment values of the integrators depend on the sub-clock position of the time base.

These and other aspects of the invention are apparent from and will be elucidated with reference to the accompanying drawings.

BRIEF DESCRIPTION OF THE SEVERAL VIEW OF THE DRAWING

Figure 3:
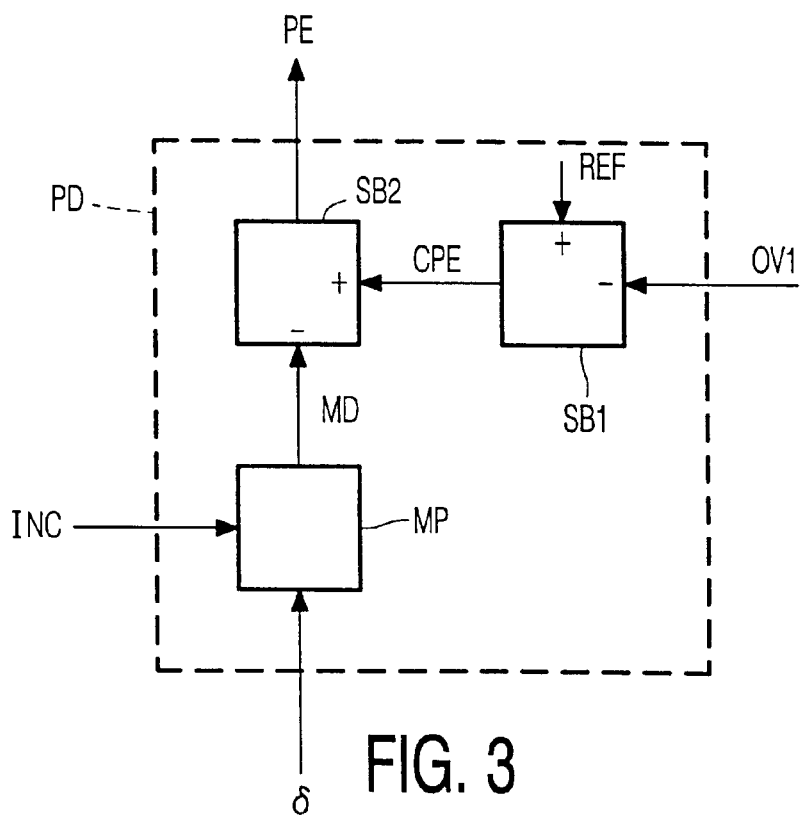
Figure 2:
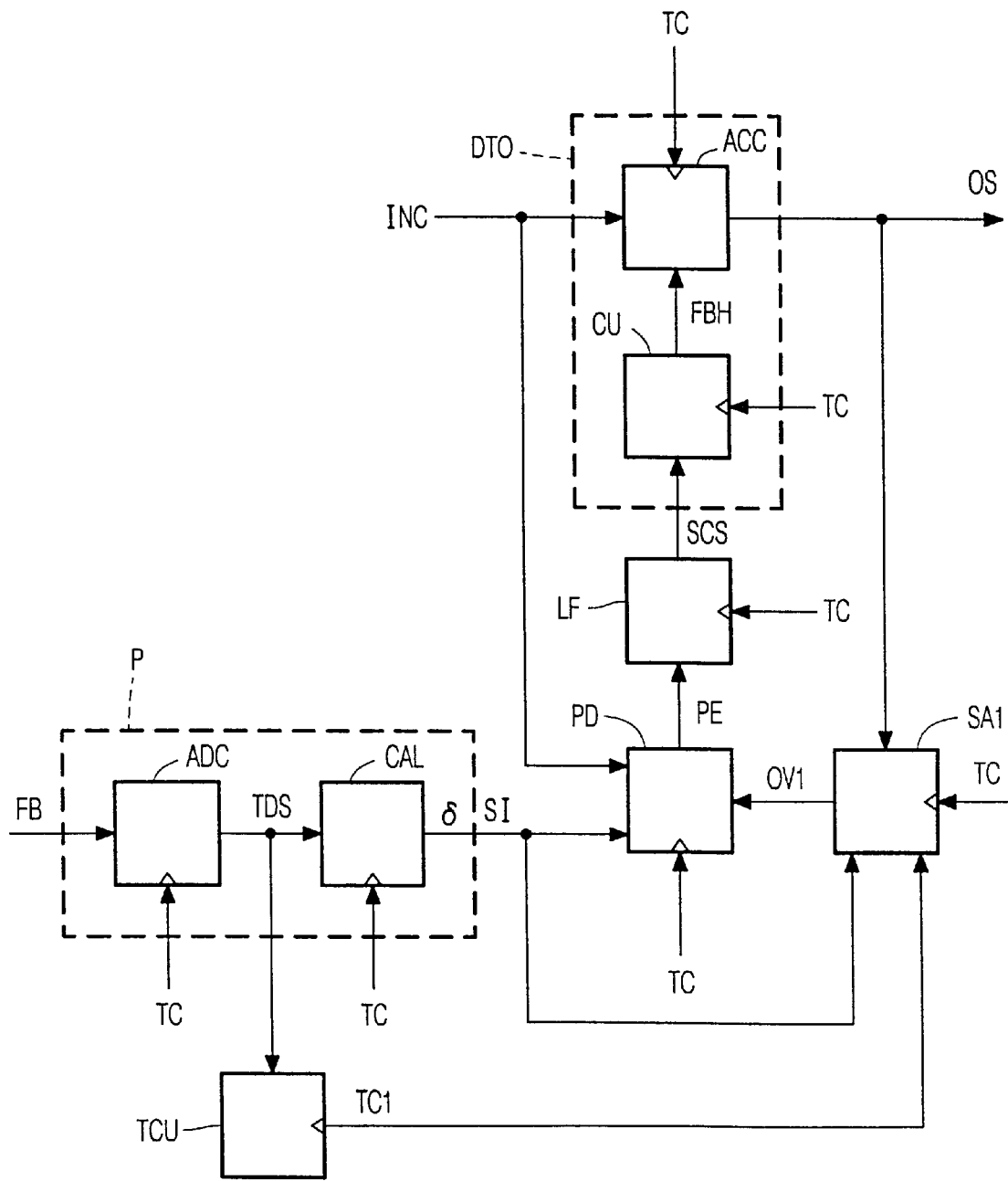
Figure 4:
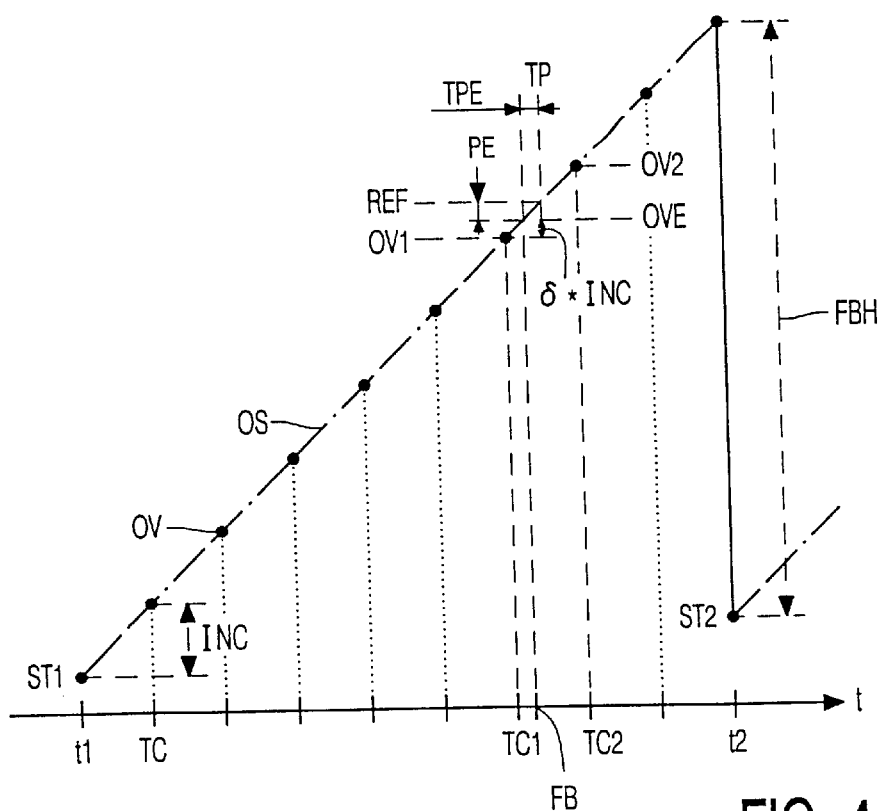
Figure 5A:
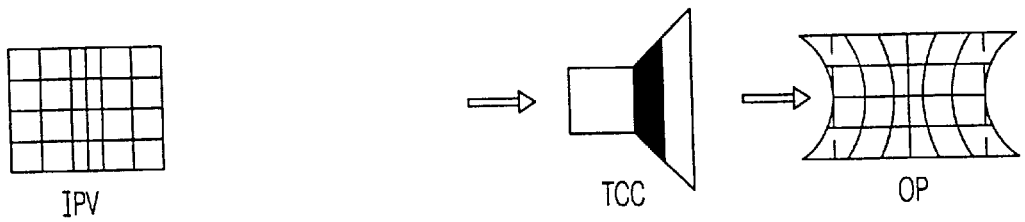
Figure 5B:
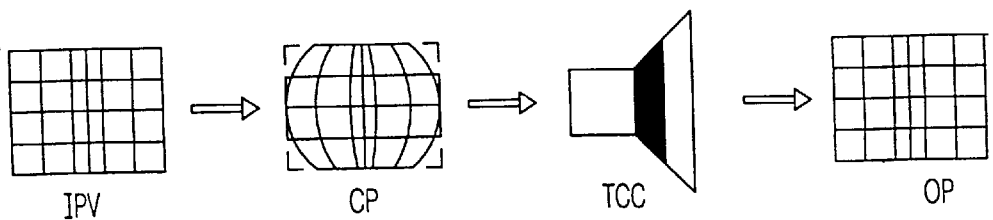
Figure 6:
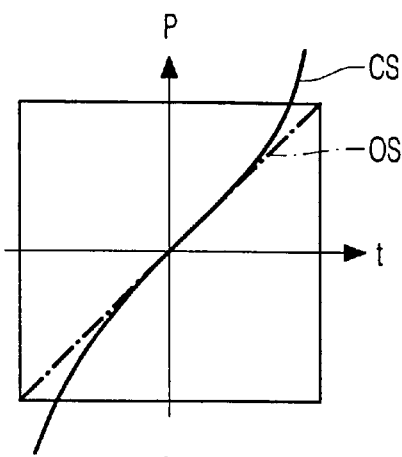
Figure 7:
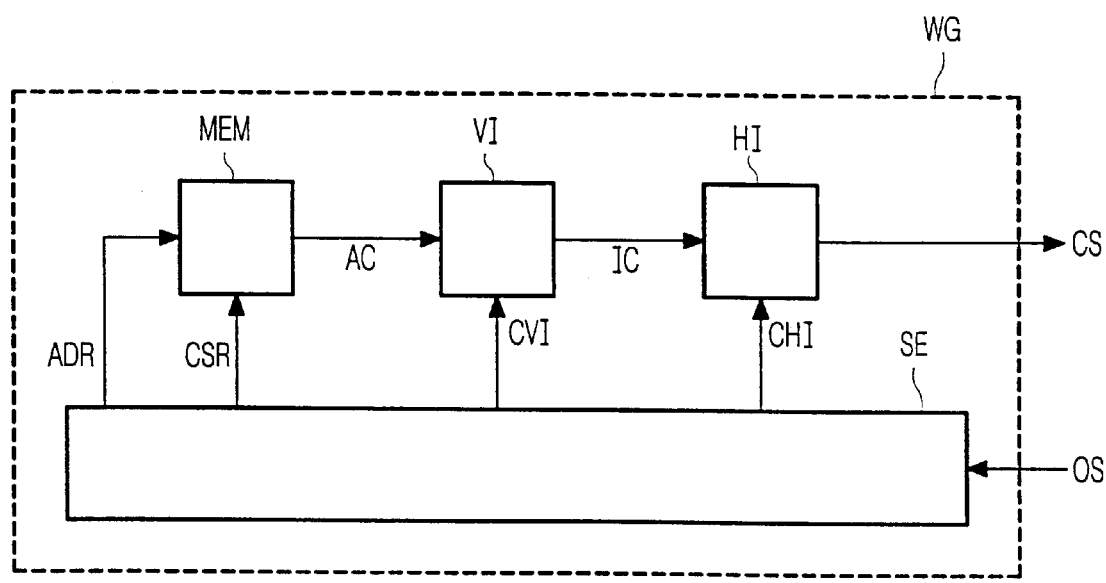
Figure 8:
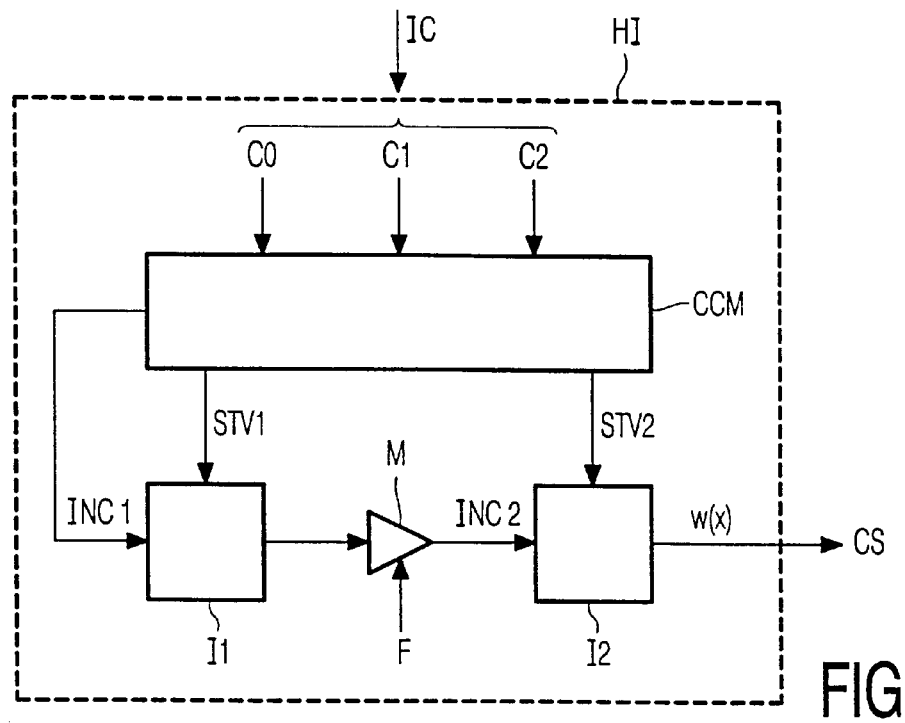
Figure 9:
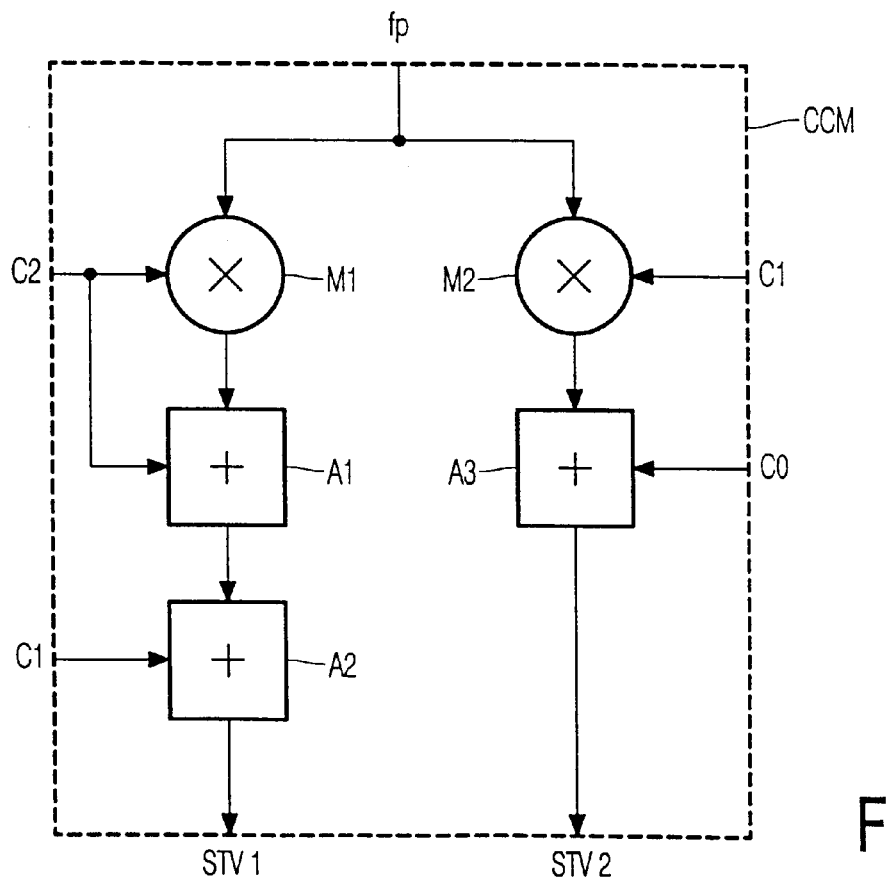

In the drawings;

FIG. 1 shows a block diagram of an output time base corrector according to the invention, FIG. 2 shows a block diagram of an embodiment of the time-discrete phase-locked loop of FIG. 1, FIG. 3 shows a block diagram of an embodiment of a phase detector PD for use in the time-discrete phase-locked loop of FIG. 2, FIG. 4 shows the time base signal generated by an embodiment of the discrete time oscillator, FIG. 5A schematically illustrates an example of geometry distortion on a display screen, and FIG. 5B schematically illustrates geometry correction by means of video interpolation according to the invention, FIG. 6 shows the time base signal and a waveform generated by the waveform generator in accordance with an embodiment of the invention, FIG. 7 shows a block diagram of a two dimensional polynomial waveform generator in accordance with an embodiment of the invention, FIG. 8 shows an embodiment of a horizontal quadratic spline waveform generator in accordance with an embodiment of the invention, and FIG. 9 shows an embodiment of a circuit according to the invention for generating integrator start values for the integrators of the spline waveform generator of FIG. 8.

DETAILED DESCRIPTION OF THE INVENTION

FIG. 1 shows a block diagram of an output time base corrector according to the invention.

A clock generator OSC generates a periodical clock signal CLK comprising clock pulses which represent clock instants TC with a fixed repetition frequency which is locked to neither a repetition frequency of a line-synchronizing signal of a received video signal VI, nor to a repetition frequency of the line deflection of the display device DD.

A time-discrete video signal processor SP receives orthogonal sampled input video samples VI and the clock signal CLK to supply orthogonal sampled video samples VS. The video samples VS occur at the clock instants TC. Orthogonal sampled indicates that the video samples VS are a function of discrete position on an orthogonal sampling grid, and each video line is represented by the same number of samples, independent of the asynchronous clock instants TC, such that, in fact, the video samples VS are locked to the repetition frequency of the line-synchronizing signal of the input video samples VI. An embodiment for generating orthogonal video samples is disclosed in the prior-art U.S. Pat. No. 5,150,201, which is hereby incorporated by reference. In the prior-art, a digital phase-locked loop (PLL1 in FIG. 1 of the prior-art) compares the phases of the digital oscillator signal and the line-synchronizing signal comprised in a digitized video signal. The phase difference controls a skew filter and a delay device in the video path.

A time-discrete signal converter SC according to the invention comprises a time-discrete sample rate converter SRC which receives the orthogonal sampled video samples VS and is controlled by a control signal CS to supply asynchronous sampled video samples VOS to the display device DD.

A control circuit CC comprises a time-discrete phase-locked loop PLL (see also FIG. 2) which generates the time base signal OS which is locked to a reference information FB related to a line frequency of a raster-scanned display screen of the display device DD. The time base signal OS is the output signal of a discrete time oscillator DTO of the phase-locked loop PLL. The time base signal OS is also referred to as oscillator signal OS. If geometry pre-correction is required, the control circuit CC may further comprise a waveform generator WG which adapts the time base signal OS in accordance with a predetermined waveform. In this case, the waveform generator WG supplies the control signal CS to the sample rate converter SRC. A geometry pre-correction is required if the display device DD comprises a picture tube deflection coil arrangement TCC (see FIG. 5A), which causes a non-constant scan rate of the electron beam across the screen of the picture tube, and if the commonly used corrections in the line deflection circuit for obtaining a constant scan rate have not been implemented. The geometry pre-correction is obtained by controlling the delay of the orthogonal sampled video signals VS with the sample rate converter SRC, such that it fits the distorted geometry on the screen. The time base signal OS is supplied as the control signal CS if no geometry pre-correction or scaling is required.

Also the time-discrete signal converter SC and the control circuit CC are clocked by the clock signal CLK.

The output time base corrector according to the invention converts the orthogonal sampled video VS into asynchronous sampled video VOS with asynchronous sample values occurring at the clock instants TC of the clock signal CLK. The asynchronous sample values VOS are interpolated from the orthogonal sampled video VS by the sample rate converter SRC. The time-discrete phase-locked loop PLL controls the sample rate converter SRC in response to a phase difference PE which may be the difference value between a reference level and a value OVE of the time base signal OS at a reference instant FB. It is also possible to control the sub-clock position of the sample rate converter SRC dependent on a phase difference between the reference instants FB and the clock instants TC.

U.S. Pat. No. 5,280,352 discloses an input sample rate converter (the correction memory and the interpolator/decimator) controlled by a time-discrete phase-locked loop. Both the input sample rate converter and the phase-locked loop are clocked by the same clock signal. The phase-locked loop determines a phase difference between a resampled synchronizing pulse at the output of the sample rate converter and a reference pulse generated from the clock signal. This input sample rate converter converts an input picture signal with a clock raster not locked to the system clock onto a reference horizontal synchronizing raster derived from the system clock by controlling the sample rate converter in such a way that the synchronization moment at the output of the sample rate converter coincides with the reference pulse. The transformed picture signal is thus present in an orthogonal raster which is defined by the reference horizontal synchronizing signal. Such an input sample rate converter generates the input signal for an output time base corrector according to the invention. In contrast, according to an aspect of the invention, the discrete phase-locked loop PLL controls an output sample rate converter SRC in such a way that an input video signal on an orthogonal sampling raster is converted into a sampling raster derived from the line frequency of the display device DD. Or, in other words, the video signal is interpolated in the sample rate converter SRC in such a way that it is correctly displayed on the display device DD although the line frequency of the display device DD is not locked to the clock signal CLK. The prior-art does not receive information about the line deflection of the display device DD. In the invention, the reference instants FB occur asynchronously with respect to the clock instants TC, while in the prior-art the synchronization reference is inherently locked to the clock instants.

FIG. 2 shows a block diagram of an embodiment of the time-discrete phase-locked loop PLL of FIG. 1.

An A/D converter ADC receives the periodically occurring analog reference instants FB and the clock instants TC to supply a time-discrete synchronizing signal TDS to a calculation unit CAL. An analog reference instant FB may be defined by an instant at which an edge of a reference pulse crosses a reference level (for example, the instant at which a clipped line flyback pulse crosses its mid-value level). The analog reference instant FB is further referred to as reference instant FB. The A/D converter ADC and the calculation unit CAL are part of a synchronization position detector P.

As known from the prior-art U.S. Pat. No. 5,181,115, herewith incorporated by reference, time-discrete synchronization instants SI may be determined by interpolating the time-discrete values of the time-discrete synchronizing signal TDS occurring during an edge of the reference pulse. The synchronization position detector P supplies the time-discrete synchronization instants SI as digital words representing a position of a reference instant FB with sub-clock period accuracy.

A discrete time oscillator DTO comprises an integrator ACC and a control unit CU. The integrator ACC supplies a periodical oscillator signal OS which represents discrete oscillator values OV at clock instants TC of the clock signal CLK. In this case, the oscillator signal OS is a digital staircase obtained by summing an increment value INC during each clock period TC. The control unit CU supplies a flyback value FBH to the integrator ACC to control a start value of the oscillator signal OS in a succeeding period. The start value depends on a control signal SCS to obtain a phase lock between the oscillator signal OS and the reference instants FB. The increment value INC has a predetermined fixed value.

A sampler SA1 samples a value OV1 of the oscillator signal OS at a clock instant TC1 related to the reference instant FB. A timing control unit TCU receives the time-discrete synchronizing signal TDS to supply the clock instant TC1. The sampler SA1 may be a D-type register receiving the oscillator signal OS at a data input, and the clock instants as an edge at a respective load enable input. If a microprocessor is used, the value OV1 may be stored in a memory.

The phase detector PD estimates a phase error PE between the oscillator signal OS and the reference instant FB by using the sampled value OV1, the synchronization instant SI, and the increment value INC. The phase detector PD calculates the phase error PE as $$PE = REF - OV - \delta * INC$$

wherein

REF is a reference value,

OV1 is the sampling value,

INC is the increment value, and $\delta$ is a factor which is a measure of the position of the reference instant FB within a clock period. If the time-discrete synchronization instant SI is represented by a digital word, the factor $\delta$ may be represented by the least significant bits which determine a fraction between two successive clock instants TC.

The phase error PE is estimated by using the increment value INC, thereby using the slope of the oscillator signal OS. It is also possible to subtract the reference value REF from the sampled value OV1 and add the multiplication of the factor $\delta$ with the increment value INC. The increment value INC may also be determined as a difference between the sampling value OV1 and a further sampling value OV2 of the oscillator signal OS sampled at a further clock instant TC2. For example, the first value OV1 may be sampled at the first clock instant TC1 after the reference instant FB. In this case, the second value OV2 may be the sampled value at a clock instant immediately preceding the reference instant FB. The selection of the sample clock instants TC1 and TC2 is not an important issue for the invention. If these sample clock instants TC1 and TC2 are also used to interpolate the synchronization instant SI, it is important that both clock instants TC1, TC2 are selected to occur during the same edge of a reference pulse FB.

An optional digital loop filter LF filters the phase error PE to supply the control signal SCS to the discrete time oscillator DTO.

An embodiment of the phase detector PD is described with respect to FIG. 3.

The operation of the time-discrete phase-locked loop according to the invention will become clear in the description of FIG. 4. Such a time-discrete phase-locked loop is described in detail in applicant's patent application PHN 16,696 not yet published.

FIG. 3 shows a block diagram of an embodiment of a phase detector PD for use in the time-discrete phase-locked loop PLL according to the invention. The phase detector PD comprises a first subtractor SB1, a multiplier MP and a second subtractor SB2. The first subtractor SB1 subtracts the sampled value OV1 from the reference value REF to supply a coarse phase error CPE. The coarse phase error CPE is a rough indication of the actual phase error between the reference instant FB and the periodic oscillator signal OS, because a value OV1 of the oscillator signal OS is used that occurs at a clock instant TC1 which is proximate to the reference instant FB only. The multiplier MP multiplies the incremental value INC by the fraction $\delta$ to obtain a multiplied difference MD. The fraction $\delta$ is a measure of the position of the reference instant FB with respect to the clock instants TC. The fraction $\delta$ may express the position of the reference instant FB or the synchronization instant SI as a percentage of the period in time between two clock instants TC1, TC2. For example, if the clock instant TC1 occurs before the clock instant TC2, $\delta=20\%$ or $\delta=0.2$ indicates that the reference instant FB occurs at the instant TC1+0.2*(TC2−TC1). The second subtractor SB2 subtracts the multiplied difference MD from the coarse phase error CPE to obtain the phase error PE. In conclusion, the phase error PE can be expressed as $$PE=REF-OV1-\delta * INC$$

In fact, the phase error PE is the difference between the reference value REF and an interpolated value OVE (see FIG. 4) of the oscillator signal OS occurring at the reference instant FB. It is possible to define the fraction $\delta$ in several other ways.

FIG. 4 shows the oscillator signal OS generated by an embodiment of the discrete time oscillator DTO. The oscillator signal OS comprises discrete values OV at clock instants TC. A period of the periodical oscillator signal OS starts at t1 with a first value ST1. The next value of the oscillator signal OS is obtained by adding a fixed increment INC to the preceding value of the oscillator signal OS. The next period of the oscillator signal starts at t2 with a pre-set value ST2. In FIG. 4, the number of clock instants TC in one period of the oscillator signal OS has been kept small for the sake of clarity. Let us assume that the reference instant FB occurs between the clock instants TC 1 and TC2 at which the oscillator signal has the values OV1 and OV2, respectively. A reference level REF crosses a straight line through the oscillator values OV at an instant TP when the reference instant FB is expected to occur. The oscillator signal OS is locked to the reference instants FB by controlling the flyback value FBH or the increment value INC in such a way that in a stable situation, the instant TP coincides with the reference instant FB. However, as shown in FIG. 4, the oscillator signal OS lags behind the reference instant FB and a phase error PE is detected. The phase error PE indicates in fact the difference in time between the reference instant FB and the instant TP. The reference instant FB is represented with sub-clock accuracy by the time-discrete synchronization instant SI which is interpolated from sample values of the reference pulse. The phase error PE can be calculated as the difference between the interpolated value OVE of the oscillator signal OS at the reference instant FB and the reference value REF.

The flyback height FBH of the oscillator signal OS is calculated on the basis of this phase error PE. In the case shown, the synchronization instant occurs early and the flyback height FBH will be decreased, resulting in a pre-set value ST2 with a higher value than the first value ST1. It is also possible to calculate the pre-set value ST2 directly. The flyback height FBH or the pre-set value ST2 may be calculated in such a way that in the next period the phase error PE will be exactly zero. It is also possible to first filter the phase error PE, for example with a (proportional and integrating) PI filter. After the second value OV2 of the oscillator signal OS has occurred, some time is needed to determine the phase error PE and the flyback height FBH or the pre-set value ST2. Consequently, in practice, it lasts a few clock periods before next period of the oscillator signal OS starts.

The oscillator signal OS, which describes a pixel position as a function of time, is used to control the sample rate converter SRC directly or via the waveform generator WG. A value OV of the oscillator signal OS determines for every instant (also between two consecutive clock instants TC) which position of the video signal has to be supplied. For example, a value OV of 7.3 of the oscillator signal indicates that a value of the video sample to be supplied has to be interpolated from surrounding input video values in accordance with a defined algorithm. The input video values occur at integral values at the clock instants TC. The integral part of an oscillator value OV determines which input video samples have to be supplied to the sample rate converter SRC. The fraction of the oscillator value OV controls a variable delay filter which performs a sub-clock period delay between zero and one clock period. A memory may be needed to store the input video samples to be supplied to the variable delay filter.

A detailed example of a sample rate converter comprising such a memory and a variable delay filter is described in U.S. Pat. No. 5,280,352, herewith incorporated by reference, as a combination of a correction memory and an interpolator/decimator.

A simple and inexpensive variable delay filter which is an "ideal" interpolation filter is disclosed as a variable phase delay filter or a non-integral delay circuit as disclosed in applicants EP-A-660514 and EP-A-576081, herewith incorporated by reference. Such output driven sample rate converters SRC perform interpolations for every requested output sample and do not suffer from a delay between the control signal CS and the output signal VOS.

The sample rate converter SRC interpolates the output video samples VOS from the input video samples VS. Or, as referred to earlier, the sample rate converter SRC delays the input video samples VS to obtain output video samples VOS which occur in the correct position on a display screen. The integral part of the variable delay is made with an offset between the write and read addresses of the input memory. The sub-pixel part of the variable delay is obtained by interpolation with the variable phase delay filter.

In a compression mode, the phase step at the output of the variable phase delay filter is larger than one sampling period of the input samples. Therefore, it should be possible to enter two successive samples into the variable phase delay filter in one clock period. In order to prevent doubling of the speed requirements, this may be realized by providing two successive samples in parallel to the input of the variable phase delay filter. As a consequence, the input memory should be multiplexed in order to allow one sample to be written and two samples to be read during a single clock period.

A polyphase filter which is able to perform some expansion and some compression is also suitable.

It is possible to define the fraction of the oscillator value OV in several ways. For example, the fraction may start at a value 1 at a start of a clock period to linearly decrease to zero at halfway the clock period and to linearly rise to 1 again from halfway the clock period to the end of the clock period. A sign bit of the fraction reverses halfway the clock period. Such a fraction is required if the variable delay filter is used as disclosed in EP-A-660514 and EP-A-576081.

FIG. 5 schematically illustrates geometry correction by means of video interpolation according to the invention. FIG. 5A shows a picture tube deflection coil arrangement TCC which is driven with a video signal originating from an input picture IPV with a perfect geometry. Without any correction measures, the picture OP displayed on a screen of the picture tube would be geometrically distorted due to imperfections of the picture tube deflection coil arrangement TCC. The shown distortions occur if no east-west correction is performed. In FIG. 5B, the input picture IPV and the picture tube deflection coil arrangement TCC are identical to the corresponding elements in FIG. 5A. In accordance with an embodiment of the invention, it is recognized that a perfect geometry of the picture OP displayed on the screen is obtained, if after the time base correction, the sample rate converter SRC is further controlled in such a way that a pre-corrected input picture CP is supplied to the picture tube deflection coil arrangement TCC. Thus, the input picture video samples IPV are delayed so as to fit with the non-constant scan rate of the electron beam along the display screen.

FIG. 6 shows the time base signal OS and a waveform generated by the waveform generator WG in accordance with an embodiment of the invention.

If no geometry corrections are required, the oscillator signal OS (shown as a dashed straight line in FIG. 6) is supplied to the sample rate converter SRC as the control signal CS to obtain the asynchronous sampled video samples VOS from the orthogonal sampled video samples VS.

If geometry corrections are required, the desired sample rate conversion factor has to deviate from this straight line, even within one video line. The curved line in FIG. 6 shows an example of a waveform generated by the waveform generator WG in the upper and lower part of the screen if the deflection is not corrected for the east-west distortion. Towards the vertical edges of the screen, the amount of delay introduced by the sample rate converter is decreased, thereby compressing the video supplied to the picture tube to compensate for the expansion due to the non-east-west corrected deflection. The waveform shows the shape of the time-discrete control signal CS.

To obtain the waveform, an accurate description of the geometry distortions which are introduced by the picture tube deflection coil arrangement TCC is required. The waveform generator WG needs to generate a waveform which is locked to the line-locked time base waveform (the output signal OS of the discrete time oscillator DTO) generated by the time-discrete phase-locked loop PLL. The shape of the waveform is adjustable. The waveform generator WG may be realized in any one of many known ways. The waveform generator WG may be a table look up system wherein the samples of the output signal OS are used to consecutively address a memory, and the waveform is composed of the values stored in the addressed cells of the memory. Such a table look-up system requires a large memory. Thus, preferably, the waveform generator WG generates the waveform by using coefficients determining a desired polynomial waveform per line.

As a conclusion, it can be said that the waveform generator WG calculates, for each input sample of the sample rate converter SRC, the delay required to obtain a corresponding output sample at the desired position in time.

FIG. 7 shows a block diagram of a two-dimensional waveform generator WG in accordance with an embodiment of the invention. The geometry correction may require a two-dimensional waveform which is a function of two variables x (line direction) and y (the position of the actual line in a raster of lines). In the case of a raster-scanned picture tube, it is usual to scan the lines in the horizontal direction (x) so that the lines in a raster follow each other in the vertical direction (y). In the case of transposed scan, the lines are scanned in the vertical direction (x) and succeed each other in the horizontal direction (y).

Let us assume that the picture is scanned in the usual way. The two-dimensional waveform must contain information for every video pixel in a raster. This enormous amount of waveform data is generated from, for example, 13 horizontal*11 vertical=143 adjustment coefficients AC, each spaced 64 pixels, respectively lines apart. Of these 143 adjustment points, 11*9=99 are selected within the visible part of the screen and the other 44 virtual points are located outside the visible part of the screen. These 44 points define the waveform slopes near the edges of the screen. The adjustment coefficients AC have to be interpolated in both the vertical and the horizontal direction.

The adjustment coefficients AC are stored in a memory MEM and are supplied to a vertical interpolator VI which interpolates intermediate coefficients IC from each of the 13 sets of the 11 vertical adjustment coefficients AC, one intermediate coefficient IC for each line, such that 13*576 intermediate coefficients IC are generated. A horizontal interpolator HI interpolates from each of the 576 sets of 13 intermediate coefficients IC the 704 data words. In this way, the two dimensional waveform is generated which comprises 704*576 data words. This stream of data words is the control signal CS supplied to the sample rate converter SRC. Both the vertical VI and the horizontal HI interpolator use the discrete time oscillator DTO samples of the output signal OS of the discrete time oscillator DTO as a time base input for determining the instants at which the interpolated data words have to be generated. A sequencer SE supplies addresses ADR and a memory control signal CSR to the memory MEM, a vertical interpolator control signal CVI to the vertical interpolator VI, and a horizontal interpolator control signal CHI to the horizontal interpolator HI to time the activities in the waveform generator WG based on the discrete time oscillator DTO samples OV.

An efficient way to generate such a two-dimensional polynomial waveform is known from applicants WO-A-97/41680, hereby incorporated by reference, which describes a two-dimensional quadratic-spline waveform generator. The line-locked time base waveform OS replaces the position information.

Both the vertical VI and the horizontal HI interpolator have to supply a parabola time-discrete output function $$w(p))=C0+p*(C1+p*C2)$$

wherein

C0, C1, C2 are the adjustable coefficients (AC or IC) per segment, p is a relative pointer within each horizontal or vertical segment, consequently: p=0, 1/64, 2/64, . . . , 63/64 if 64 pixels or lines occur in one segment. The relative pointer p is coupled to the output signal OS of the discrete time oscillator DTO.

The vertical quadratic spline interpolator VI has to supply one new data value every horizontal segment, that is once every 64 pixels. Thus, the speed of the vertical spline interpolator VI is not critical because 64 clock pulses are available to calculate a next data value. Therefore, the vertical quadratic spline interpolator VI is preferably a sequential RISC processor which is programmed to perform the multiplications and additions required.

The horizontal spline interpolator HI has to perform an interpolation in the time available between two consecutive sample values. It is therefore implemented as a parallel machine with time-discrete multipliers. An advantageous embodiment of the horizontal spline interpolator HI is based on the insight that p increases linearly from 0 to 1 within one horizontal segment. In this case, multiplying with a linearly increasing number p is identical to discrete integration. Consequently, the two multiplication's with p to obtain the time-discrete output function w(p) can be replaced by a series arrangement of two time-discrete integrators I1, I2 (see FIG. 8) each comprising an adder and a storage register. The addition of the two multiplied terms in w(p) can be eliminated by pre-setting the two integrators as will be elucidated with respect to FIG. 8. The number p is linked to the output signal OS of the discrete time oscillator DTO. Because the number p should increase linearly, the oscillator signal OS should have a constant increment. The time-discrete PLL should therefore be controlled by altering the flyback height HFB.

FIG. 8 shows an embodiment of the horizontal quadratic spline waveform generator HI according to the invention. The horizontal quadratic spline waveform generator HI comprises a first time-discrete integrator I1, a multiplier M, a second time-discrete integrator I2, and a calculation unit CCM which receives the intermediate coefficients IC as C0, C1, and C2.

The first integrator I1 adds a first incremental value INC1 to a first start value STV1 for every pixel in a horizontal segment. The first integrator I1 is pre-set to the first start value STV1 at the start of every horizontal segment. In case a segment comprises 64 pixels, the first start value STV1= C1+1/64*C2, and the first incremental value INC12/64*C2. Consequently, the first integrator I1 supplies the next sequence of values:

at p=0 C1+1/64*C2 at p=1/64 C1+3/64*C2 at p=63/64 C1+127/64*C2

The multiplier M multiplies the output values of the first integrator I1 with a factor F which is the reciprocal of the number of pixels in a segment, in this case, F=1/64. In practice, such a division by a power of two is performed by a simple bit shift circuit.

The second integrator I2 adds a second incremental value INC2 which is the output value of the multiplier M1 to a second start value STV2 for every pixel in a horizontal segment. The second integrator I2 is pre-set to the second start value STV2 at the start of every horizontal segment. In case a segment comprises 64 pixels, the second start value STV2=C0, and the second integrator I2 supplies the next sequence of values:

at p=0 C0 at p=1/64 C0+1/64*(C1+1/64*C2)

at p=2/64 C0+1/64*(2*C1+4/64*C2)

at p=1 C0+1/64*(64*C1+64*64/64*C2)=C0+C1+C2

The calculation unit CCM calculates the first incremental value INC1 and the start values STV1 and STV2 from the coefficients C0, C1 and C2. The second integrator I2 supplies the waveform w(p) which is the control signal CS.

The discrete time oscillator DTO of the time-discrete phase-locked loop PLL supplies an output signal OS comprising a series of oscillator values OV at clock instants TC representing a line-locked sawtooth-shaped time base with unity slope (the increment during the scan is +1.0 every clock pulse) and a controlled variable high resolution flyback FBH. The oscillator values OV comprise an integer part indicating the clock pulse number and a fractional part determined by the flyback value. The integer part of the oscillator values OV determines when a segment starts, the fractional part determines a sub-clock accuracy of the time base signal OS.

The horizontal waveform generator HI preferably should be locked to the line-locked time base signal OS with sub-clock accuracy to avoid jitter. This is possible by adapting the first and the second start values STV1, STV2 of the first and second integrators I1, I2 as discussed with respect to FIG. 9.

FIG. 9 shows an embodiment according to the invention for generating the first and the second start values STV1, STV2.

As discussed earlier, the horizontal spline waveform generator HI has to supply a time-discrete output function $$w(p)=C0+p*(C1+p*C2)$$

A small horizontal time offset (the fractional part determined by the fraction δ) fp causes $$w(p+fp)=C0+(p+fp)*(C1+(p+fp)*C2)$$

which can be written as $$w(p+fp)=C0'+p*(C1'+p*C2)$$

wherein $$C0'=C0+fp*C1+fp^2*C2 \approx C0+fp*C1$$

$$C1'=C1+2*fp*C2$$

As a conclusion, the horizontal spline waveform is locked with sub-pixel accuracy to the line-locked time base if: the first start value STV1 is:

$$STV1=C1'+1/64*C2'=C1+(1/64+2*fp)*C2$$

and the second start value STV2 is:

$$STV2=C0'=C0+fp*C1$$

These are simple corrections to be performed only once per segment. The corrections can be calculated with hardware adders and multipliers or with a suitably programmed computer.

The embodiment of FIG. 9 comprises a first multiplier MI multiplying the fractional part fp with the coefficient C2, a first adder A1 adding the coefficient C2 to the result of the first multiplication, and a second adder A2 adding the coefficient C1 to the result of the first addition to supply the first start value STV1. The embodiment of FIG. 9 further comprises a second multiplier M2 multiplying the fractional part fp with the coefficient C1, and a third adder A3 adding the coefficient C0 to the result of the second multiplication to supply the second start value STV2.

While the invention has been described in connection with preferred embodiments, it will be understood that modifications thereof within the principles outlined above will be evident to those skilled in the art and thus the invention is not limited to the preferred embodiments but is intended to encompass such modifications.

Although most of the embodiments use hardware circuits, it is also possible to apply a suitably programmed computer to perform the calculations.

The number of pixels or lines in a segment may be selected to have a value different than 64. At a fixed clock frequency, the accuracy of the correction waveform increases if the number of segments increases and thus the number of pixels per segment decreases.

The waveform generator WG is elucidated with respect to a two-dimensional quadratic-spline generator. It is possible to use a one-dimensional waveform generator WG if the correction is required dependent on one direction only. If a more complex waveform for the control signal CS is required, it is possible to use a higher than a second order spline waveform generator WG. The waveform generator WG may generate other functions than spline functions.

To conclude, in an embodiment of the invention, an output time base corrector converts orthogonal sampled video VS into asynchronous sampled video VOS with asynchronous sample values occurring at clock instants TC of a clock signal CLK. The asynchronous sampled video VOS is displayed on a display screen of a display device DD. A discrete time oscillator DTO of a time-discrete phase-locked loop PLL supplies a time base signal OS. The time-discrete phase-locked loop PLL determines a phase difference PE between the time base signal OS and reference instants FB indicating a timing of a line deflection of the display device DD to obtain the time base signal OS being locked to the reference instants FB. The time base signal OS controls a sample rate converter SRC such that the asynchronous video values VOS which occur at the clock instants TC are interpolated from the orthogonal sampled video VS by the sample rate converter SRC such that the video signal is displayed on the correct position on the display screen. In the output time base corrector according to the invention all circuits are clocked by clock signals CLK originating from one and the same clock generator OSC.

What is claimed is:

1. An output timebase corrector comprising:
   a clock generator (OSC) for determining clock instants (TC),
   a control circuit (CC) for generating a control signal (CS) in dependence on reference instants (FB) indicating a timing of a line deflection of a display device (DD),
   a time-discrete signal converter (SC) for receiving the clock instants (TC), video samples (VS) on an orthogonal sampling grid, and the control signal (CS) to supply asynchronous output video samples (VOS) to the display device (DD),
   characterized in that
   said clock generator determines said clock instants with a fixed repetition frequency independent of line synchronizing signals in received video signals and independent of a repetition frequency of the line deflection of the display device,
   the control circuit (CC) comprises a time-discrete phase-locked loop (PLL) for receiving the clock instants (TC) and the reference instants (FB) to supply a time base signal (OS) being locked to the reference instants (FB), and
   said signal converter (SC) comprises a sample rate converter (SRC) for receiving said time base signal (OS) as the control signal (CS) to supply said output video samples (VOS) at said clock instants (TC).

2. An output timebase corrector as claimed in claim 1, characterized in that the control circuit (CC) further comprises a waveform generator (WG) for receiving the time base signal (OS) to supply the control signal (CS) being the time base signal (OS) adapted according to a predetermined waveform.

3. An output timebase corrector as claimed in claim 1, characterized in that the time-discrete phase-locked loop (PLL) comprises:
   position determining means (P) for receiving the reference instants (FIB) being an analog signal to supply time-discrete synchronization instants (SI) with a sub-clock accuracy,
   a discrete time oscillator (DTO) comprising an integrator (ACC) for summing an increment value (INC) at the clock instants (TC) to supply the time base signal (OS), and
   a phase detector (PD) for determining a difference value (PE) between a reference value (REF) and a sampling value (OVE) of the time base signal (OS) at one of said reference instants (FB), the phase detector (PD) comprising a control unit (CU) for controlling a period of said time base signal (OS) in dependence on said difference value (PE).

4. An output timebase corrector as claimed in claim 3, characterized in that the control unit (CU) is adapted for controlling a flyback height (FBH) of the time-discrete oscillator (DTO), and in that said control circuit (CC) further comprises a waveform generator (WG) for receiving said time base signal (OS) as a time base to supply the control signal (CS), the waveform generator (WG) comprising at least one time-discrete integrator (I1; I2) receiving a start value (STV1; STV2) and an incremental value (INC1; INC2), and means (CCM) for calculating the start value (STV1; STV2) from selectable coefficients (C0, C1, C2) to supply a polynomial waveform w(x) locked to said time base signal (OS) and a having a shape determined by the selectable coefficients (C0, C1, C2).

5. An output timebase corrector as claimed in claim 4, characterized in that the means (CCM) for calculating the start value (STV1; STV2) is adapted to calculate the start value (STV1; STV2) in response to a sub clock position (fp) of the time base.

6. An output timebase corrector as claimed in claim 3, characterized in that the phase detector (PD) comprises a sampler (SA1) for sampling the time base signal (OS) at a clock instant (TC1) related to the one of said reference instants (FB) to obtain a sampling value (OV1), and in that the phase detector (PD) is adapted to calculate the phase error (PE) as PE=REF−(OV1+δ*INC) wherein REF is said reference value (REF), OV1 is the sampling value (OV1), INC is the increment value (INC), and δ is a fraction indicating the position of the one of said reference instants (FB) within a clock period.

7. A method of output timebase correction, the method comprising the steps of:
   determining (OSC) clock instants (TC),
   generating (CC) a control signal (CS) in dependence on reference instants (FB) indicating a timing of a line deflection of a display device (DD),
   converting (SC), under control of the control signal (CS), video samples (VS) on an orthogonal sampling grid into asynchronous output video samples (VOS) being supplied to the display device (DD),
   characterized in that
   the step of determining clock instants determines said clock instants with a fixed repetition frequency independent of line synchronizing signals in received video signals and independent of a repetition frequency of the line deflection of the display device, the step of generating (CC) a control signal (CS) comprises a time-discrete phase-locked loop step (PLL) of receiving the clock instants (TC) and the reference instants (FB) to supply a time base signal (OS) being locked to the reference instants (FB), and said converting step (SC) comprises a sample rate converter step (SRC) of receiving said time base signal (OS) as the control signal (CS) to supply said output video samples (VOS) at said clock instants (TC).

8. A display device (DD) with an output timebase corrector comprising:

a clock generator (OSC) for determining clock instants (TC), a control circuit (CC) for generating a control signal (CS) in dependence on reference instants (FB) indicating a timing of a line deflection of the display device (DD), a time-discrete signal converter (SC) for receiving the clock instants (TC), video samples (VS) on an orthogonal sampling grid, and the control signal (CS) to supply asynchronous output video samples (VOS) to the display device (DD), characterized in that said clock generator determines said clock instants with a fixed repetition frequency independent of line synchronizing signals in received video signals and independent of a repetition frequency of the line deflection of the display device, the control circuit (CC) comprises a time-discrete phase-locked loop (PLL) for receiving the clock instants (TC) and the reference instants (FB) to supply a time base signal (OS) being locked to the reference instants (FB), and said signal converter (SC) comprises a sample rate converter (SRC) for receiving said time base signal (OS) as the control signal (CS) to supply said output video samples (VOS) at said clock instants (TC).

* * * * *